US012772756B2

(12) United States Patent
Lee et al.

(10) Patent No.: US 12,772,756 B2
(45) Date of Patent: Oct. 20, 2026

(54) INSULATION PLATE AND SUBSTRATE PROCESSING APPARATUS INCLUDING THE SAME

(71) Applicant: SEMES Co., Ltd., Chungcheongnam-do (KR)

(72) Inventors: Dong Mok Lee, Chungcheongnam-do (KR); Jin Il Sung, Gyeonggi-do (KR); Soo Woong Kim, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 817 days.

(21) Appl. No.: 17/532,079

(22) Filed: Nov. 22, 2021

(65) Prior Publication Data

US 2022/0172947 A1 Jun. 2, 2022

(30) Foreign Application Priority Data

Nov. 27, 2020 (KR) ........................ 10-2020-0162005

(51) Int. Cl.
*H01L 21/306* (2006.01)
*H01J 37/32* (2006.01)
(Continued)

(52) U.S. Cl.
CPC .... *H10P 14/6302* (2026.01); *H01J 37/32091* (2013.01); *H01J 37/321* (2013.01); *H01J 37/3211* (2013.01); *H01J 37/32477* (2013.01); *H01J 37/32522* (2013.01); *H01J 37/32715* (2013.01); *H10P 72/18* (2026.01)

(58) Field of Classification Search
CPC ........... H01J 37/32715; H01J 37/32091; H01J 37/321; H01J 37/32724
See application file for complete search history.

(56) References Cited

U.S. PATENT DOCUMENTS 5,571,366 A * 11/1996 Ishii .................... H01J 37/3299 216/60
8,555,810 B2 10/2013 Park et al.
(Continued)

FOREIGN PATENT DOCUMENTS

JP 2017063128 A 3/2017
KR 20100060417 A 6/2010
(Continued)

OTHER PUBLICATIONS

Korean Request for the Submission of an Opinion for Korean Application No. 10-2020-0162005, dated Dec. 6, 2022 with translation, 17 pages.

*Primary Examiner* — Luz L Alejandro Mulero
(74) *Attorney, Agent, or Firm* — Buchanan Ingersoll & Rooney P.C

(57) ABSTRACT

Provided is an apparatus for processing a substrate using plasma, in which an etching rate can be controlled using an insulation plate provided with an air-gap. The substrate processing apparatus includes a chamber including a processing space for processing a substrate using plasma, and a support module located in the processing space and for supporting the substrate, wherein the support module includes a support plate for receiving high frequency power and a first surface disposed under the support plate and facing the support plate, and at least one first recess is formed on the first surface.

12 Claims, 8 Drawing Sheets

(51) Int. Cl.
*H10P 14/60* (2026.01)
*H10P 72/10* (2026.01)

(56) References Cited

U.S. PATENT DOCUMENTS

| | | | |
|---|---|---|---|
| 10,629,467 | B2 | 4/2020 | Kwon et al. |
| 2004/0163601 | A1* | 8/2004 | Kadotani .......... H01J 37/32724 118/728 |
| 2008/0170969 | A1* | 7/2008 | Yoshioka ............... G05D 23/22 422/109 |
| 2009/0321017 | A1* | 12/2009 | Tsubone .............. H01L 21/6719 156/345.27 |
| 2010/0096088 | A1* | 4/2010 | Okita .................... H01J 37/321 156/345.48 |
| 2014/0376148 | A1* | 12/2014 | Sasaki ...................... B23Q 3/15 361/234 |
| 2015/0262794 | A1* | 9/2015 | Kihara .............. H01J 37/32568 216/71 |
| 2016/0155614 | A1 | 6/2016 | Kim et al. |
| 2017/0358475 | A1* | 12/2017 | Kwon ................... H01L 21/687 |
| 2018/0308722 | A1* | 10/2018 | Umeki .............. H01L 21/67109 |
| 2018/0358253 | A1* | 12/2018 | Noh .................. H01J 37/32724 |
| 2019/0122869 | A1* | 4/2019 | Han .................... H01L 21/6831 |

FOREIGN PATENT DOCUMENTS

| | | | |
|---|---|---|---|
| KR | 101559913 | B1 | 10/2015 |
| KR | 20160065382 | A | 6/2016 |
| KR | 20160148093 | A | * 12/2016 |
| KR | 20170140926 | A | 12/2017 |
| KR | 20190033672 | A | 4/2019 |

* cited by examiner

INSULATION PLATE AND SUBSTRATE PROCESSING APPARATUS INCLUDING THE SAME

CROSS REFERENCE TO RELATED APPLICATION

This application claims the benefit of Korean Patent Application No. 10-2020-0162005, filed on Nov. 27, 2020, in the Korean Intellectual Property Office, the disclosure of which is incorporated herein by reference in its entirety.

FIELD OF THE INVENTION

The present invention relates to an insulation plate and a substrate processing apparatus including the same.

BACKGROUND OF THE INVENTION

When manufacturing a semiconductor device or a display device, various processes using plasma (e.g., etching, ashing, ion implantation, cleaning, etc.) may be used. A substrate processing apparatus using plasma may be classified into a capacitively coupled plasma (CCP) type and an inductively coupled plasma (ICP) type according to a plasma generation method. In the CCP type, two electrodes are disposed to face each other in a chamber, and an RF signal is applied to one or both of the two electrodes to form an electric field in the chamber to generate plasma. On the other hand, in the ICP type, one or more coils are installed in a chamber, and an RF signal is applied to the coil to induce an electromagnetic field in the chamber to generate plasma.

SUMMARY OF THE INVENTION

Meanwhile, in the ICP type substrate processing apparatus, an insulation plate (or a ceramic isolator) is disposed below the electrostatic chuck, on which the substrate is mounted. The insulation plate prevents the bias power from being lost to the lower portion of the substrate processing apparatus. However, the conventional insulation plate changes the reactance (X), which affects the bias power loss, depending on the intrinsic dielectric constant (εr) and the capacitance (C) of the material. Since the envelope voltage ($V_{rms}$) is determined according to the reactance (X), there is a limit to the improvement of the etching rate.

An aspect of the present invention is a substrate processing apparatus using plasma capable of controlling an etching rate using an insulation plate provided with an air-gap installed.

Another aspect of the present invention is an insulation plate provided with an air-gap installed, which is used in a substrate processing apparatus using plasma.

The problems of the present invention are not limited to the problems mentioned above, and other problems not mentioned will be clearly understood by those skilled in the art from the following description.

One aspect of the substrate processing apparatus of the present invention for achieving the above object comprises a chamber including a processing space for processing a substrate using plasma; and a support module located in the processing space and for supporting the substrate, wherein the support module comprises a support plate for receiving high frequency power, and an insulation plate disposed under the support plate and including a first surface facing the support plate, wherein at least one first recess is formed on the first surface.

Another aspect of the substrate processing apparatus of the present invention for achieving the above object comprises a housing having an open upper surface and including a processing space; a dielectric substance window for covering an upper surface of the housing and including a gas supply hole for supplying a process gas into the processing space; an antenna in the form of a coil disposed on a sealing cover, and for receiving first high frequency power to excite the process gas into plasma; and a support module located in the processing space and for supporting the substrate, wherein the support module comprises a support plate for receiving second high frequency power and guiding the plasma to be supplied in a direction of the substrate, an insulation plate disposed under the support plate, and a lower cover disposed under the insulation plate, wherein the insulation plate includes a first surface facing the support plate and a second surface facing the lower cover, and at least one recess is formed on at least one of the first surface and the second surface.

One aspect of the insulation plate of the present invention for achieving the above other object is used in a substrate processing apparatus for processing a substrate using plasma, and comprises a body having a cylindrical shape including an upper surface and a lower surface, and being made of a ceramic material; a through hole passing through a center of the body; and a recess formed on at least one of the upper surface and the lower surface and constituting an air-gap.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE INVENTION

Figure 1:
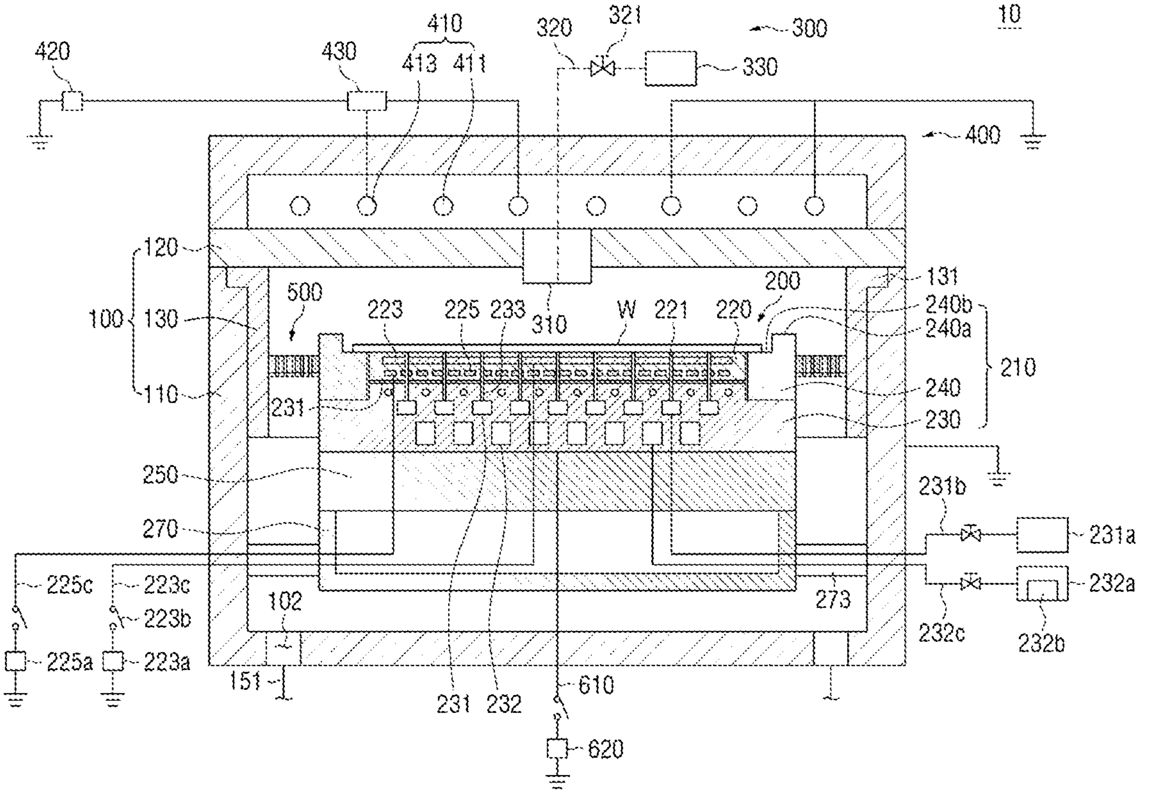
FIG. 1 is a cross-sectional view for describing a substrate processing apparatus according to some embodiments of the present disclosure.

Hereinafter, preferred embodiments of the present invention will be described in detail with reference to the accompanying drawings. Advantages and features of the present invention and methods of achieving them will become apparent with reference to the embodiments described below in detail in conjunction with the accompanying drawings. However, the present invention is not limited to the embodiments described below, but may be implemented in various different forms, and these embodiments are provided only for making the description of the present invention complete and fully informing those skilled in the art to which the present invention pertains on the scope of the invention, and the present invention is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present invention.

FIG. 1 is a cross-sectional view for describing a substrate processing apparatus according to some embodiments of the present disclosure. FIG. 1 illustrates a substrate processing apparatus for generating plasma by an inductively coupled plasma (ICP) method by way of example, but the present invention is not limited thereto.

Referring to FIG. 1, the substrate processing apparatus 10 according to some embodiments of the present disclosure processes the substrate W using plasma. For example, the substrate processing apparatus 10 may perform an etching process on the substrate W. The substrate processing apparatus 10 may include a process chamber 100, a support unit 200, a gas supply unit 300, a plasma generating unit 400, and a baffle unit 500.

The process chamber 100 provides a space, in which a substrate processing process is performed. The process chamber 100 includes a housing 110, a sealing cover 120, and a liner 130.

The housing 110 has a space with an open upper surface therein. The inner space of the housing 110 is provided as a processing space, in which a substrate processing process is performed. The housing 110 is provided with a metal material. The housing 110 may be provided with an aluminum material. The housing 110 may be grounded. An exhaust hole 102 is formed on the bottom surface of the housing 110. The exhaust hole 102 is connected to the exhaust line 151. Reaction by-products generated during the process and gas remaining in the inner space of the housing may be discharged to the outside through the exhaust line 151. The inside of the housing 110 is decompressed to a predetermined pressure by the exhaust process.

The sealing cover 120 covers the open upper surface of the housing 110. The sealing cover 120 is provided in a plate shape and seals the inner space of the housing 110. The sealing cover 120 may include a dielectric substance window.

The liner 130 is provided inside the housing 110. The liner 130 is formed in a space with open upper and lower surfaces. The liner 130 may be provided in a cylindrical shape. The liner 130 may have a radius corresponding to the inner surface of the housing 110. The liner 130 is provided along the inner surface of the housing 110. A support ring 131 is formed on the upper end of the liner 130. The support ring 131 is provided as a ring-shaped plate, and protrudes to the outside of the liner 130 along the circumference of the liner 130. The support ring 131 is placed on the upper end of the housing 110 and supports the liner 130. The liner 130 may be provided with the same material as the housing 110. That is, the liner 130 may be provided with an aluminum material. The liner 130 protects the inner surface of the housing 110. Arc discharge may be generated inside the chamber 100 while the process gas is excited. Arc discharge damages peripheral devices. The liner 130 protects the inner surface of the housing 110 to prevent the inner surface of the housing 110 from being damaged by arc discharge. In addition, impurities generated during the substrate processing process are prevented from being deposited on the inner wall of the housing 110. The liner 130 has a lower cost than the housing 110 and is easy to replace. Accordingly, when the liner 130 is damaged by arc discharge, an operator may replace the liner 130 with a new one.

The substrate support unit 200 is located inside the housing 110. The substrate support unit 200 supports the substrate W. The substrate support unit 200 may include an electrostatic chuck 210 for adsorbing the substrate W using an electrostatic force. Alternatively, the substrate support unit 200 may support the substrate W in various ways such as mechanical clamping. Hereinafter, the support unit 200 including the electrostatic chuck 210 will be described.

The support unit 200 includes an electrostatic chuck 210, an insulation plate 250, and a lower cover 270. The support unit 200 may be located to be spaced apart from the bottom surface of the housing 110 upwardly in the chamber 100.

The electrostatic chuck 210 includes a dielectric plate 220, a lower electrode 223, a heater 225, a support plate 230, and a focus ring 240.

The dielectric plate 220 is located at an upper end of the electrostatic chuck 210. The dielectric plate 220 is provided as a disk-shaped dielectric substance. A substrate W is placed on the upper surface of the dielectric plate 220. The upper surface of the dielectric plate 220 has a smaller radius than the substrate W. Accordingly, the edge region of the substrate W is located outside the dielectric plate 220. A first supply passage 221 is formed in the dielectric plate 220. The first supply passage 221 is provided from the upper surface to the lower surface of the dielectric plate 210. A plurality of first supply passages 221 are formed to be spaced apart from each other, and are provided as passages, through which the heat transfer medium is supplied to the lower surface of the substrate W.

A lower electrode 223 and a heater 225 are embedded in the dielectric plate 220. The lower electrode 223 is located above the heater 225. The lower electrode 223 is electrically connected to the first lower power supply 223*a*. The first lower power supply 223*a* includes a DC power supply. A switch 223*b* is installed between the lower electrode 223 and the first lower power supply 223*a*. The lower electrode 223 may be electrically connected to the first lower power supply 223*a* by turning on/off the switch 223*b*. When the switch 223*b* is turned on, a direct current is applied to the lower electrode 223. An electrostatic force acts between the lower electrode 223 and the substrate W by the current applied to the lower electrode 223, and the substrate W is adsorbed to the dielectric plate 220 by the electrostatic force.

The heater 225 is electrically connected to the second lower power supply 225*a*. The heater 225 generates heat by resisting the current applied from the second lower power supply 225*a*. The generated heat is transferred to the substrate W through the dielectric plate 220. The substrate W is maintained at a predetermined temperature by the heat generated by the heater 225. The heater 225 includes a spiral-shaped coil.

A support plate 230 is located under the dielectric plate 220. The lower surface of the dielectric plate 220 and the upper surface of the support plate 230 may be adhered by an adhesive 236. The support plate 230 may be provided with an aluminum material. The upper surface of the support plate 230 may be stepped so that the central region is higher than the edge region. The central region of the upper surface of the support plate 230 has an area corresponding to the lower surface of the dielectric plate 220 and is adhered to the lower surface of the dielectric plate 220. A first circulation passage 231, a second circulation passage 232, and a second supply passage 233 are formed in the support plate 230.

Figure 10:
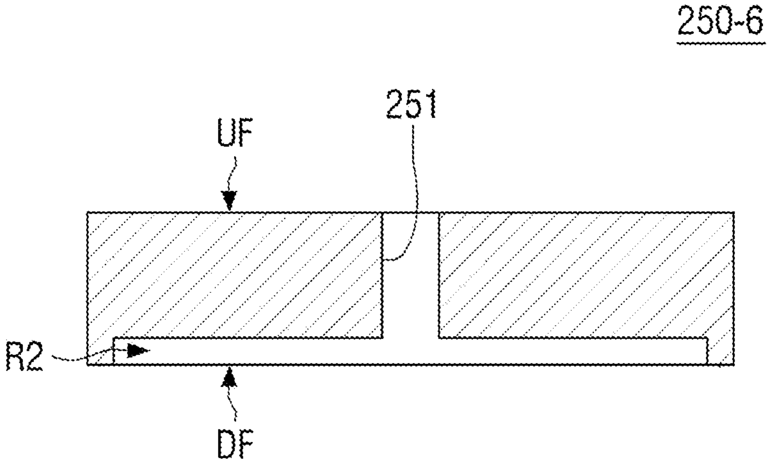
FIG. 10 is a cross-sectional view for describing an insulation plate according to a seventh embodiment of the present disclosure.

The support plate 230 may include a metal plate. The support plate 230 may be connected to the high frequency power supply 620 by the high frequency transmission line 610. The support plate 230 may receive power from the high frequency power supply 620 so that plasma generated in the processing space is smoothly supplied to the substrate. That is, the support plate 230 may function as an electrode. In addition, although the substrate processing apparatus 10 in FIG. 10 is configured as an ICP type, it is not limited thereto, and the substrate processing apparatus 10 according to an embodiment of the present disclosure may be configured as a CCP type. When the substrate processing apparatus 10 is configured as a CCP type, the high frequency transmission line 610 may be connected to a lower electrode for generating plasma to apply power from the high frequency power supply 620 to the lower electrode.

The first circulation passage 231 is provided as a passage, through which the heat transfer medium circulates. The first circulation passage 231 may be formed in a spiral shape inside the support plate 230. Alternatively, the first circulation passage 231 may be arranged such that ring-shaped passages having different radii have the same center. Each of the first circulation passages 231 may communicate with each other. The first circulation passage 231 is formed at the same height.

The second circulation passage 232 is provided as a passage through which the cooling fluid circulates. The second circulation passage 232 may be formed in a spiral shape inside the support plate 230. In addition, the second circulation passages 232 may be arranged so that ring-shaped passages having different radii have the same center. Each of the second circulation passages 232 may communicate with each other. The second circulation passage 232 may have a larger cross-sectional area than the first circulation passage 231. The second circulation passages 232 are formed at the same height. The second circulation passage 232 may be located in the lower portion of the first circulation passage 231.

The second supply passage 233 extends upwardly from the first circulation passage 231 and is provided on the upper surface of the support plate 230. The second supply passage 243 is provided in a number corresponding to the first supply passage 221 and connects the first circulation passage 231 and the first supply passage 221.

The first circulation passage 231 is connected to the heat transfer medium storage unit 231*a* through the heat transfer medium supply line 231*b*. A heat transfer medium is stored in the heat transfer medium storage unit 231*a*. The heat transfer medium includes an inert gas. According to an embodiment, the heat transfer medium includes helium (He) gas. The helium gas is supplied to the first circulation passage 231 through the supply line 231*b*, and is supplied to the lower surface of the substrate W sequentially passing through the second supply passage 233 and the first supply passage 221. The helium gas serves as a medium through which heat transferred from the plasma to the substrate W is transferred to the electrostatic chuck 210.

The second circulation passage 232 is connected to the cooling fluid storage unit 232*a* through the cooling fluid supply line 232*c*. A cooling fluid is stored in the cooling fluid storage unit 232*a*. A cooler 232*b* may be provided in the cooling fluid storage unit 232*a*. The cooler 232*b* cools the cooling fluid to a predetermined temperature. Alternatively, the cooler 232*b* may be installed on the cooling fluid supply line 232*c*. The cooling fluid supplied to the second circulation passage 232 through the cooling fluid supply line 232*c* circulates along the second circulation passage 232 to cool the support plate 230. The support plate 230 cools the dielectric plate 220 and the substrate W together while being cooled to maintain the substrate W at a predetermined temperature.

The focus ring 240 is disposed on an edge region of the electrostatic chuck 210. The focus ring 240 has a ring shape and is disposed along the circumference of the dielectric plate 220. The upper surface of the focus ring 240 may be stepped such that the outer portion 240*a* is higher than the inner portion 240*b*. The inner portion 240*b* of the upper surface of the focus ring 240 is located at the same height as the upper surface of the dielectric plate 220. The upper inner portion 240*b* of the focus ring 240 supports an edge region of the substrate W located outside the dielectric plate 220. The outer portion 240*a* of the focus ring 240 is provided to surround the edge region of the substrate W. The focus ring 240 allows plasma to be concentrated in a region facing the substrate W in the chamber 10.

An insulation plate 250 is located under the support plate 230. The insulation plate 250 is provided with a cross-sectional area corresponding to the support plate 230. The insulation plate 250 is located between the support plate 230 and the lower cover 270. The insulation plate 250 is provided with an insulating material and electrically insulates the support plate 230 and the lower cover 270.

By forming an air-gap by forming recesses on one or both surfaces of the insulation plate 250, the magnitude of the reactance X affecting power loss can be adjusted. A specific structure of the insulation plate 250 will be described later with reference to FIGS. 2 to 10.

The lower cover 270 is located at the lower end of the substrate support unit 200. The lower cover 270 is located to be spaced apart from the bottom surface of the housing 110 upwardly. The lower cover 270 has a space with an open upper surface therein. The upper surface of the lower cover 270 is covered by the insulation plate 250. Accordingly, the outer radius of the cross-section of the lower cover 270 may be the same length as the outer radius of the insulation plate 250. A lift pin module (not shown) for moving the transferred substrate W from an external transfer member to the electrostatic chuck 210 may be located in the inner space of the lower cover 270.

The lower cover 270 has a connecting member 273. The connecting member 273 connects the outer surface of the lower cover 270 and the inner wall of the housing 110. A plurality of connecting members 273 may be provided on the outer surface of the lower cover 270 at regular intervals. The connecting member 273 supports the substrate support unit 200 in the chamber 100. In addition, the connecting member 273 is connected to the inner wall of the housing 110 so that the lower cover 270 is electrically grounded. A first power line 223*c* connected to the first lower power supply 223*a*, a second power line 225*c* connected to the second lower power supply 225*a*, a heat transfer medium supply line 231*b* connected to the heat transfer medium storage unit 231*a*, and a cooling fluid supply line 232*c* connected to the cooling fluid storage unit 232*a* extend into the lower cover 270 through the inner space of the connecting member 273.

The gas supply unit 300 supplies a process gas into the chamber 100. The gas supply unit 300 includes a gas supply nozzle 310, a gas supply line 320, and a gas storage unit 330. The gas supply nozzle 310 is installed in the central portion of the sealing cover 120. An injection hole is formed on the lower surface of the gas supply nozzle 310. The injection hole is located under the sealing cover 12, and supplies a process gas to the processing space inside the chamber 100. The gas supply line 320 connects the gas supply nozzle 310 and the gas storage unit 330. The gas supply line 320 supplies the process gas stored in the gas storage unit 330 to the gas supply nozzle 310. A valve 321 is installed in the gas supply line 320. The valve 321 opens and closes the gas supply line 320 and controls the flow rate of the process gas supplied through the gas supply line 320.

The plasma generating unit 400 excites the process gas in the chamber 100 into a plasma state. According to an embodiment of the present disclosure, the plasma generating unit 400 may be configured as an ICP type.

The plasma generating unit 400 may include a high frequency power supply 420, a first antenna 411, a second antenna 413, and a power distributor 430. The high frequency power supply 420 supplies a high frequency signal (i.e., an RF signal).

The first antenna 411 and the second antenna 413 are connected in series with the high frequency power supply 420. Each of the first antenna 411 and the second antenna 413 may be provided as a coil wound with a plurality of times. The first antenna 411 and the second antenna 413 are electrically connected to the high frequency power supply 420 to receive RF power. The power distributor 430 distributes the power supplied from the high frequency power supply 420 to the first antenna 411 and the second antenna 413.

The first antenna 411 and the second antenna 413 may be disposed at positions facing the substrate W. For example, the first antenna 411 and the second antenna 413 may be installed above the process chamber 100. The first antenna 411 and the second antenna 413 may be provided in a ring shape. In this case, the radius of the first antenna 411 may be smaller than the radius of the second antenna 413. Also, the first antenna 411 may be located inside the upper portion of the process chamber 100, and the second antenna 413 may be located outside the upper portion of the process chamber 100.

In some embodiments, the first and second antennas 411 and 413 may be disposed on the side portion of the process chamber 100. According to an embodiment, any one of the first and second antennas 411 and 413 may be disposed above the process chamber 100, and the other may be disposed on the side portion of the process chamber 100. As long as the plurality of antennas generate plasma within the process chamber 100, the position of the coil is not limited.

The first antenna 411 and the second antenna 413 may receive RF power from the high frequency power supply 420 to induce a time-varying electromagnetic field in the chamber, and accordingly, the process gas supplied to the process chamber 100 may be excited to plasma.

The baffle unit 500 is located between the inner wall of the housing 110 and the substrate support unit 200. The baffle unit 500 includes a baffle, in which a through hole is formed. The baffle is provided in the shape of an annular ring. The process gas provided in the housing 110 passes through the through holes of the baffle and is exhausted to the exhaust hole 102. The flow of the process gas may be controlled according to the shape of the baffle and the shape of the through holes.

Figure 2:
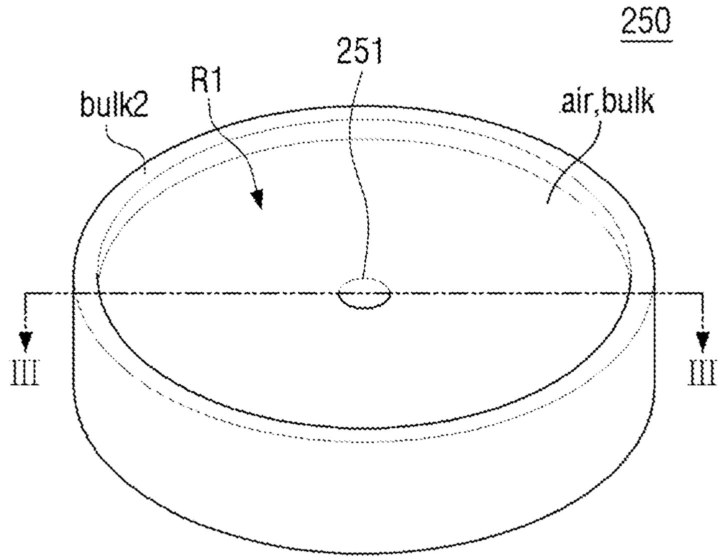
FIG. 2 is a perspective view illustrating an insulation plate according to a first embodiment of the present disclosure.
Figure 3:
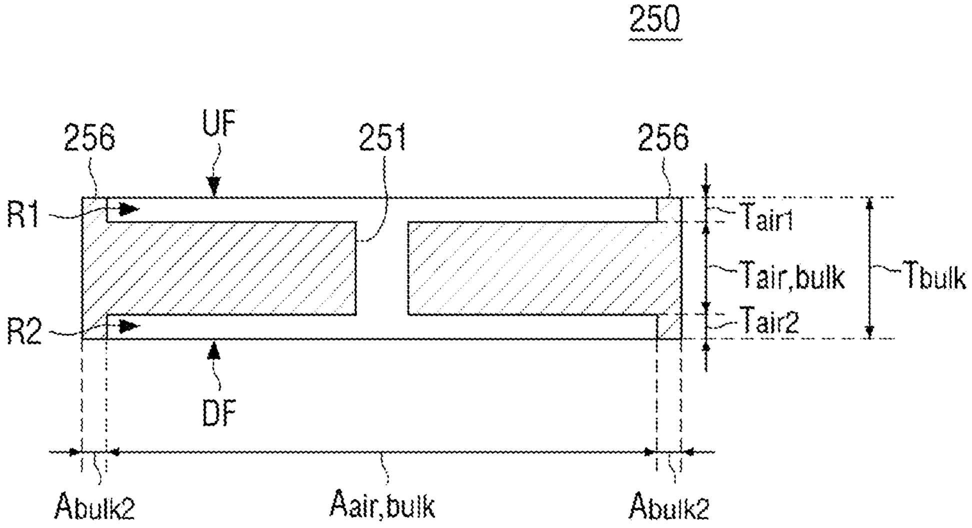
FIG. 3 is a cross-sectional view taken along of FIG. 2.

FIG. 2 is a perspective view illustrating an insulation plate according to a first embodiment of the present disclosure. FIG. 3 is a cross-sectional view taken along III-III of FIG. 2.

Referring to FIGS. 2 and 3, the insulation plate 250 includes a first surface UF and a second surface DF facing each other, has a cylindrical shape, and includes a body made of a ceramic material. The first surface UF faces the support plate (230 in FIG. 1), and the second surface DF faces the lower cover 270.

At least one first recess R1 is formed on the first surface UF, and at least one second recess R2 is also formed on the second surface. When the recesses R1 and R2 are filled with air, an air-gap is formed between the first surface UF and the support plate 230 and between the second surface DF and the lower cover 270.

In addition, the insulation plate 250 includes a first region (or an edge region) (bulk2) and a second region (or a central region) (air,bulk) located inside the first region 256. The upper surface 256 of the first region (bulk2) is in contact with the support plate 230 to support the support plate 230. At least one recess R1 may be formed in the second region (air,bulk).

Also, as described above, the support plate 230 is connected to the high frequency power supply 620 by a high frequency transmission line (see 610 of FIG. 1). More specifically, a rod connected to the high frequency transmission line 610 passes through the insulation plate 250, and the rod supplies high frequency power to the support plate 230. Accordingly, in the second region (air,bulk) of the insulation plate 250, a through hole 251, through which a rod for supplying high frequency power passes, is disposed.

At least one of the first and second recesses R1 and R2 formed on the first surface UF and the second surface DF may lower the total capacitance $C_{total}$ of the insulation plate 250.

Specifically, referring to Equation 1, $C_{total}$ is the total capacitance of the insulation plate 250, $C_{bulk2}$ is the capacitance of the first region (or, the edge region) (bulk2), and $$\frac{C_{air} \times C_{air,bulk}}{C_{air} + C_{air,bulk}}$$

refers to the capacitance of the second region (or the central region) (air,bulk). $C_{air}$ is the capacitance of the first recess R1 and the second recess R2 in the second region (air,bulk), $C_{air,bulk}$ is the capacitance of a region excluding the first recess R1 and the second recess R2 in the second region (air,bulk). Also, $A_{bulk2}$ is the area of the first region (or edge region) (bulk2), and $A_{air,bulk}$ is the area of the second region (or the central region) (air,bulk). $T_{bulk}$ is the total thickness of the insulation plate 250, $T_{air}$ refers to the sum thickness of the first recess R1 and the second recess R2 (i.e., $T_{air1}+T_{air2}$), $T_{air,bulk}$ refers to the thickness that $T_{bulk}$ minus $T_{air}$, $\varepsilon_r$ is the dielectric constant of the material of the insulation plate 250, and $\varepsilon_0$ is the dielectric constant of air.

$$C_{total} = C_{bulk2} + \frac{C_{air} \times C_{air,bulk}}{C_{air} + C_{air,bulk}} = \varepsilon_0\varepsilon_r\frac{A_{bulk2}}{T_{bulk}} + \frac{\varepsilon_0\frac{A_{air,bulk}}{T_{air}} \times \varepsilon_0\varepsilon_r\frac{A_{air,bulk}}{T_{air,bulk}}}{\varepsilon_0\frac{A_{air,bulk}}{T_{air}} + \varepsilon_0\varepsilon_r\frac{A_{air,bulk}}{T_{air,bulk}}} \quad \text{[Equation 1]}$$

Using Equation 1, it can be seen that the total capacitance $C_{total}$ of the insulation plate 250 in which the air gap is formed, is smaller than the total capacitance of the insulation plate, in which the air gap is not formed. For example, when $T_{bulk}$ is 34 mm, $T_{air}$ is 1 mm, $A_{air,bulk}$ is 57,427 $mm^2$, and the total area ($A_{air,bulk}+A_{bulk2}$) is 93,992 $mm^2$, the total capacitance $C_{total}$ of the insulation plate 250, in which an air-gap is formed, is reduced by about 13.2% compared to the total capacitance of the insulation plate 250 without an air-gap. When the total capacitance $C_{total}$ decreases, the reactance X increases. When the reactance X increases, the envelope voltage $V_{rms}$ of the plasma increases and the etching rate is improved.

As a result, first and second recesses R1 and R2 are formed in the insulation plate 250, thereby forming an air-gap. By adjusting the shape, size, thickness, etc. of the first and second recesses R1 and R2, the total capacitance $C_{total}$ can be controlled, and thus the etching rate by plasma can be controlled.

Meanwhile, although FIG. 3 illustrates that the thickness $T_{air1}$ of the first recess R1 and the thickness $T_{air2}$ of the second recess R2 are substantially the same, the present invention is not limited thereto. For example, the thickness $T_{air1}$ of the first recess R1 may be thicker than the thickness $T_{air2}$ of the second recess R2.

Figure 4:
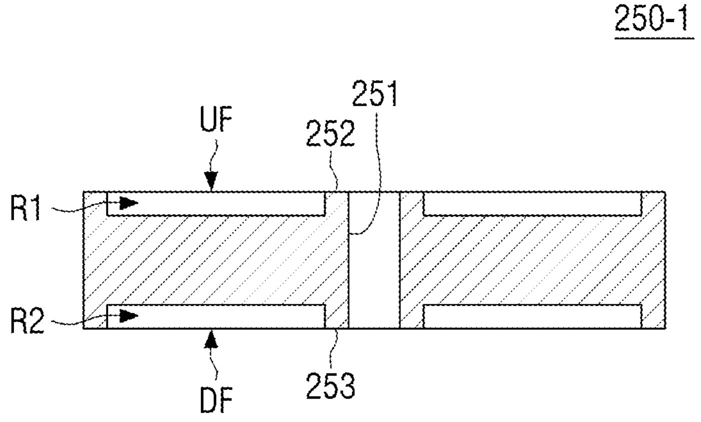
FIG. 4 is a perspective view illustrating an insulation plate according to a second embodiment of the present disclosure.

FIG. 4 is a perspective view illustrating an insulation plate according to a second embodiment of the present disclosure. For convenience of description, the points different from those described with reference to FIGS. 2 and 3 will be mainly described.

Referring to FIG. 4, in the insulation plate 250-1 according to the second embodiment of the present disclosure, a through hole 251, through which a rod for transferring high frequency power to the support plate (see 230 in FIG. 1) passes, is formed.

A protection unit 252 surrounding a portion of a side surface of the rod is installed on the first surface UF of the insulation plate 250-1. An upper surface of the protection unit 252 may protrude higher than a bottom surface of the first recess R1. That is, the upper surface of the protection unit 252 is closer to the support plate 230 than the bottom surface of the first recess R1. Due to such a shape, the upper surface of the protection unit 252 may be in contact with the support plate 230 to stably support the support plate 230 together with the upper surface 256 of the first region (bulk2).

Similarly, a protection unit 253 surrounding a portion of a side surface of the rod is also installed on the second surface DF of the insulation plate 250-1. A lower surface of the protection unit 253 may protrude downward from a bottom surface of the second recess R2. That is, the lower surface of the protection unit 253 is closer to the lower cover 270 than the bottom surface of the second recess R2. With such a shape, the lower surface of the protection unit 253 may contact the lower cover 270.

Figure 5:
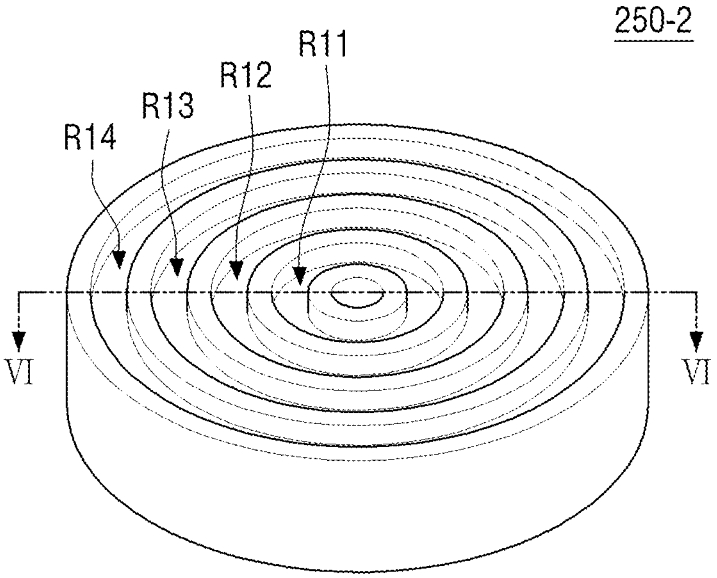
FIG. 5 is a perspective view illustrating an insulation plate according to a third embodiment of the present disclosure.
Figure 6:
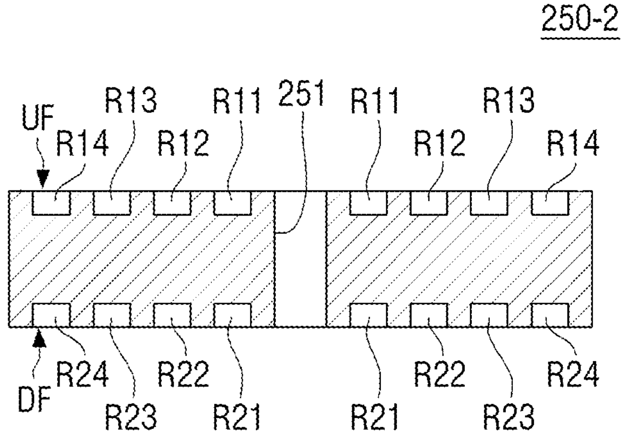
FIG. 6 is a cross-sectional view taken along line VI-VI of FIG. 5.

FIG. 5 is a perspective view illustrating an insulation plate according to a third embodiment of the present disclosure. FIG. 6 is a cross-sectional view taken along line VI-VI of FIG. 5. For convenience of description, the points different from those described with reference to FIGS. 2 to 4 will be mainly described.

Referring to FIGS. 5 and 6, a plurality of first partial recesses R11, R12, R13, and R14 that are distinguished from each other may be formed on the first surface UF of the insulation plate 250-2 according to the third embodiment of the present disclosure, and a plurality of second partial recesses R21, R22, R23, and R24 that are distinguished from each other may be formed on the second surface DF.

In addition, although it is illustrated that partial recesses R11 to R14 and R21 to R24 are formed on both the first surface UF and the second surface DF in FIG. 5, the present invention is not limited thereto. That is, the plurality of first partial recesses R11, R12, R13, and R14 may be formed on the first surface UF, and the second partial recess may not be formed on the second surface DF.

In addition, in FIG. 5, the number of first partial recesses R11, R12, R13, and R14 formed on the first surface UF and the number of the second partial recesses R21, R22, R23 and R24 formed on the second surface DF are illustrated as being the same, but the present invention is not limited thereto. That is, the number of the first partial recesses R11, R12, R13, and R14 formed on the first surface UF and the number of the second partial recesses R21, R22, R23, and R24 formed on the second surface DF may be different from each other.

Figure 7:
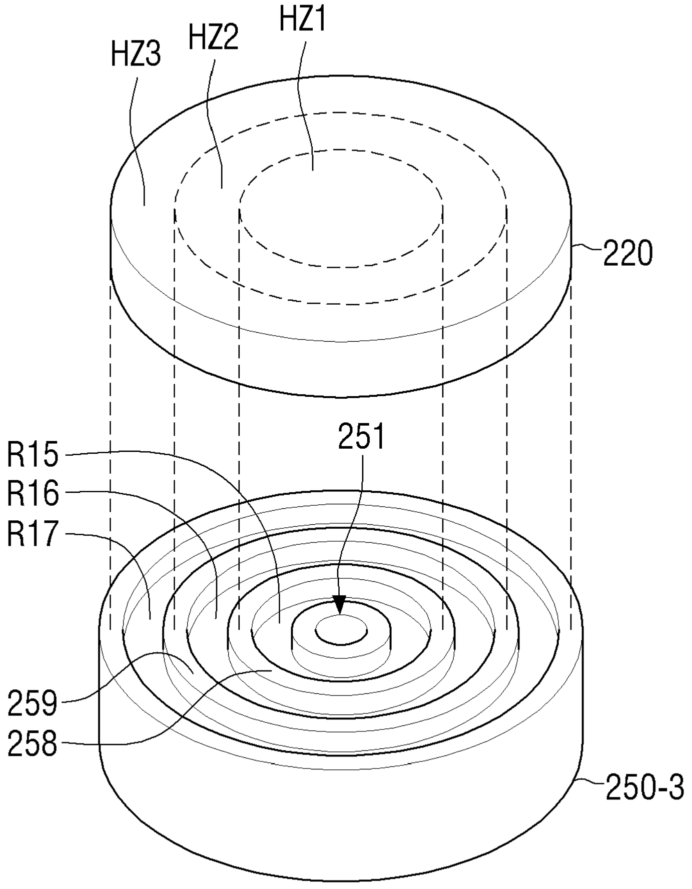
FIG. 7 is a perspective view illustrating an insulation plate according to a fourth embodiment of the present disclosure.

FIG. 7 is a perspective view illustrating an insulation plate according to a fourth embodiment of the present disclosure. For convenience of description, the points different from those described with reference to FIGS. 2 to 6 will be mainly described.

Referring to FIG. 7, the dielectric plate 220 is disposed above the support plate (see 230 in FIG. 1). A heater (see 225 in FIG. 1) for controlling the temperature of the substrate W is installed inside the dielectric plate 220.

In particular, the dielectric plate 220 is divided into heating zones HZ1, HZ2, HZ3 controllable at different temperatures. That is, in each of the plurality of heating zones HZ1, HZ2, HZ3, a corresponding heating unit is installed. Each heating unit can be individually temperature controlled.

More specifically, in the insulation plate 250-3, a through hole 251, through which a rod for transferring high frequency power to the support plate 230 passes, is installed, and a plurality of partial recesses R15, R16 and R17 may be arranged in a ring shape around the through hole 251. That is, the partial recess R15 may be formed in a ring shape around the through hole 251, the partial recess R16 may be formed in a ring shape around the partial recess R15, and the partial recess R17 may be formed in a ring shape around the partial recess R16.

In addition, the protrusion unit 258 dividing the partial recess R15 and the partial recess R16 corresponds to a boundary region between the corresponding heating zone HZ1 and the heating zone HZ2. The protrusion unit 259 dividing the partial recess R16 and the partial recess R17 corresponds to a boundary region between the corresponding heating zone HZ2 and heating zone HZ3.

Figure 8:
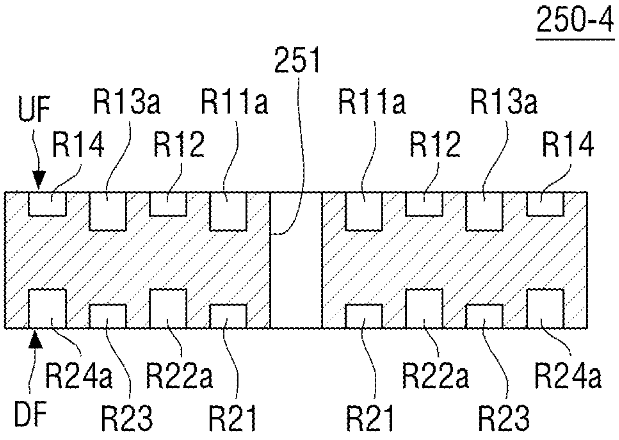
FIG. 8 is a perspective view illustrating an insulation plate according to a fifth embodiment of the present disclosure.

FIG. 8 is a perspective view illustrating an insulation plate according to a fifth embodiment of the present disclosure. For convenience of description, the points different from those described with reference to FIGS. 2 to 7 will be mainly described.

Referring to FIG. 8, a plurality of first partial recesses R11*a*, R12, R13*a*, and R14 that are distinguished from each other may be formed on the first surface UF of the insulation plate 250-4 according to the fifth embodiment of the present disclosure, and a plurality of second partial recesses R21, R22*a*, R23, and R24*a* that are distinguished from each other may be formed on the second surface DF.

In particular, among the plurality of first partial recesses R11*a*, R12, R13*a*, and R14, thicknesses of some first partial recesses R11*a* and R13*a* and the other first partial recesses R12 and R14 may be different from each other. That is, the thickness of the first partial recesses R11*a* and R13*a* is thicker than the thickness of the first partial recesses R12 and R14.

Also, among the plurality of second partial recesses R21, R22*a*, R23, and R24*a*, thicknesses of some second partial recesses R22*a* and R24*a* and the other second partial recesses R21 and R23 may be different from each other. That is, the thickness of the second partial recesses R22*a* and R24*a* is thicker than the thickness of the second partial recesses R21 and R23.

In order to stably support the support plate 230 and lower the total capacitor $C_{total}$ of the insulation plate 250-4 (that is, to increase the volume of the air-gap), some first partial recesses R11*a* and R13*a* and some second partial recesses R22*a* and R24*a* may be thickened.

Figure 9:
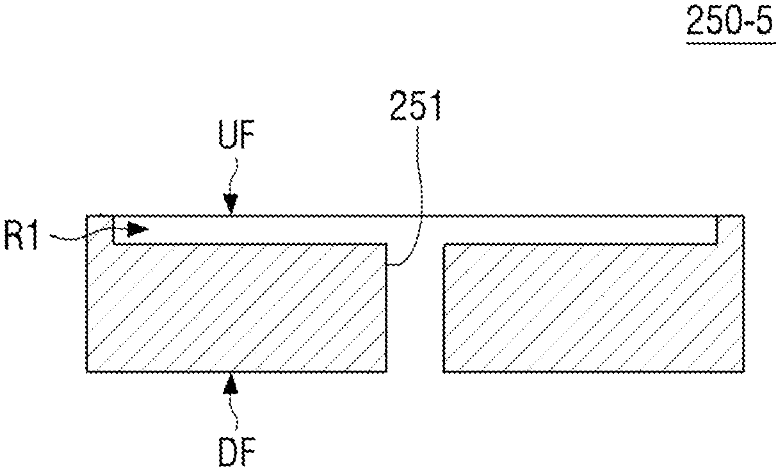
FIG. 9 is a cross-sectional view for describing an insulation plate according to a sixth embodiment of the present disclosure.

FIG. 9 is a cross-sectional view for describing an insulation plate according to a sixth embodiment of the present disclosure. FIG. 10 is a cross-sectional view for describing an insulation plate according to a seventh embodiment of the present disclosure. For convenience of description, the points different from those described with reference to FIGS. 2 to 8 will be mainly described.

Referring to FIG. 9, in the insulation plate 250-5 according to the sixth embodiment of the present disclosure, a first recess R1 is formed on the first surface UF, and a second recess R2 is not formed on the second surface DF. On the other hand, referring to FIG. 10, in the insulation plate 250-6 according to the seventh embodiment of the present disclosure, the first recess R1 is not formed on the first surface UF and a second recess R2 is formed on the second surface DF.

Figure 11:
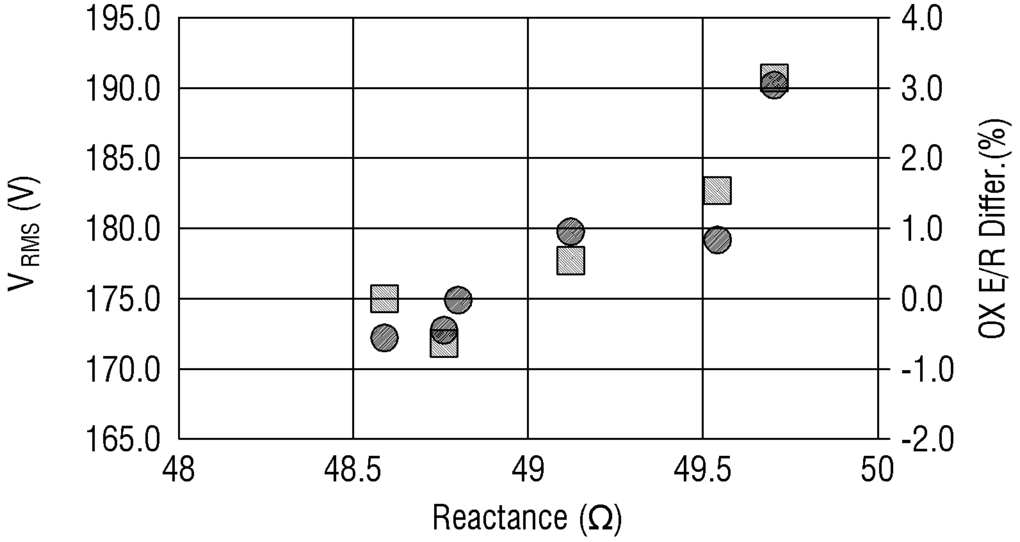
FIG. 11 is a view for describing an effect of a substrate processing apparatus according to some embodiments of the present disclosure.

FIG. 11 is a view for describing an effect of a substrate processing apparatus according to some embodiments of the present disclosure.

Referring to FIG. 11, the x-axis is reactance, the y-axis on the left is the envelope voltage $V_{rms}$, and the y-axis on the right is the etching rate of the oxide layer. ■ indicates the envelope voltage (V), and • indicates the etching rate (%) of the oxide film. It can be seen that as the reactance increases from 48.5Ω to 50Ω, the envelope voltage (V) increases and the etching rate (%) of the oxide film also increases. The amount of the air-gap may be adjusted by adjusting the number/thickness of the recesses of the insulation plates 250 to 250-6 described with reference to FIGS. 2 to 10. By adjusting the reactance by adjusting the amount of the air gap, the etching rate (%) of the oxide layer can also be adjusted.

Although embodiments of the present invention have been described with reference to the above and the accompanying drawings, it could be understood that those of ordinary skill in the art to which the present invention pertains can practice the present invention in other specific forms without changing its technical spirit or essential features. Therefore, it should be understood that the embodiments described above are illustrative in all respects and not limiting.

What is claimed is:

1. An apparatus for processing a substrate comprising:

a chamber including a processing space for processing a substrate using plasma; and a support module located in the processing space and for supporting the substrate, wherein the support module comprises, a support plate for receiving high frequency power, and an insulation plate disposed under the support plate and including a first surface facing the support plate, the insulation plate comprising a through hole extending from the first surface to an opposed second surface of the insulation plate, wherein at least one first recess is formed between the first surface and the support plate, the at least one first recess including a plurality of recesses, each of the plurality of recesses having a ring shape completely encircling the through hole, at least one of the recesses having a different thickness than at least another one of the recesses.

2. The apparatus of claim 1 further comprises, a lower cover disposed under the insulation plate, wherein the insulation plate includes a second surface facing the lower cover, and at least one second recess is formed on the second surface.

3. The apparatus of claim 1, wherein the insulation plate includes a first region and a second region located inside the first region, wherein an upper surface of the first region is in contact with the support plate to support the support plate, wherein the at least one first recess is formed on the second region.

4. The apparatus of claim 1, wherein a rod for transferring the high frequency power to the support plate passes through the through hole, wherein a protection unit surrounding a portion of a side surface of the rod is installed on the first surface, wherein an upper surface of the protection unit is closer to the support plate than a bottom surface of the first recess.

5. The apparatus of claim 4, wherein an upper surface of the protection unit is in contact with the support plate to support the support plate.

6. The apparatus of claim 4, wherein the plurality of recesses are separate from the through hole.

7. The apparatus of claim 1, wherein a dielectric plate is further included above the support plate, and a heater for controlling a temperature of the substrate is installed inside the dielectric plate, wherein the heater includes a plurality of heating units controllable to different temperatures, wherein the dielectric plate is divided into a plurality of heating zones, and each of the plurality of heating zones corresponds to each of the plurality of heating units.

8. The apparatus of claim 7, wherein plurality of recesses are partial recesses that are distinguished from each other, and each of the plurality of first partial recesses corresponds to each of the plurality of heating zones.

9. The apparatus of claim 1 wherein the plurality of recesses are filled with air.

10. An apparatus for processing a substrate comprising:

a housing having an open upper surface and including a processing space;

a dielectric substance window for covering an upper surface of the housing and including a gas supply hole for supplying a process gas into the processing space;

an antenna in the form of a coil for receiving first high frequency power to excite the process gas into plasma; and a support module located in the processing space and for supporting the substrate, wherein the support module comprises, a support plate for receiving second high frequency power and guiding the plasma to be supplied in a direction of the substrate, an insulation plate disposed under the support plate, and a lower cover disposed under the insulation plate, wherein the insulation plate includes a first surface facing the support plate and a second surface facing the lower cover, the insulation plate comprising a through hole extending from the first surface to the second surface, and at least one recess is between the first surface and the support plate, the at least one recess including a plurality of recesses, each of the plurality of recesses having a ring shape completely encircling the through hole, at least one of the recesses having a different thickness than at least another one of the recesses.

11. The apparatus of claim 10, wherein a rod for transferring the high frequency power to the support plate passes through the through hole, wherein a protection unit surrounding a portion of a side surface of the rod is installed on the first surface, wherein an upper surface of the protection unit is closer to the support plate than a bottom surface of a recess formed on the first surface.

12. The apparatus of claim 11, wherein a dielectric plate is further included above the support plate, and a heater for controlling a temperature of the substrate is installed inside the dielectric plate, wherein the heater includes a plurality of heating units controllable to different temperatures, wherein the dielectric plate is divided into a plurality of heating zones, and each of the plurality of heating zones corresponds to each of the plurality of heating units.

* * * * *